United States Patent [19]

Vig

[11] Patent Number: 5,652,550

[45] Date of Patent: *Jul. 29, 1997

[54] METHOD AND APPARATUS FOR ISOLATING AN OSCILLATOR FROM EXTERNAL MECHANICAL AND THERMAL EFFECTS USING AEROGELS

[75] Inventor: John R. Vig, Colts Neck, N.J.

[73] Assignee: The United States of America as represented by the Secretary of the Army, Washington, D.C.

[*] Notice: The term of this patent shall not extend beyond the expiration date of Pat. No. 5,488,333.

[21] Appl. No.: 587,437

[22] Filed: Jan. 17, 1996

Related U.S. Application Data

[63] Continuation-in-part of Ser. No. 366,121, Dec. 29, 1994, abandoned.

[51] Int. Cl.$^6$ .................. H05K 5/06; H03B 1/00
[52] U.S. Cl. ................... 331/68; 331/67; 331/69
[58] Field of Search .................. 331/68, 58, 67, 331/69, 66; 310/321, 344, 345, 346

[56] References Cited

U.S. PATENT DOCUMENTS

| 5,089,794 | 2/1992 | Norimatsu | 331/68 |
| 5,488,333 | 1/1996 | Vig | 331/66 |

Primary Examiner—Robert Pascal
Assistant Examiner—David Vu
Attorney, Agent, or Firm—Michael Zelenka; William H. Anderson

[57] ABSTRACT

An oscillator is isolated from external mechanical and thermal effects by surrounding the oscillator on all sides with an aerogel insulation structure that provides both thermal insulation and vibrational isolation above some predetermined low frequency limit which is a function of the mass of the oscillator and the nature of the aerogel insulation structure.

12 Claims, 6 Drawing Sheets

5,652,550

METHOD AND APPARATUS FOR ISOLATING AN OSCILLATOR FROM EXTERNAL MECHANICAL AND THERMAL EFFECTS USING AEROGELS

NOTICE OF CONTINUATION

This application is a continuation-in-part of U.S. Patent and Trademark Office application Ser. No. 08/366,121, entitled "Isolating an Oscillator from External Mechanical and Thermal Effects," by inventor John R. Vig, Attorney Docket No. CECOM 4652, filed Dec. 29, 1994, now abandoned.

GOVERNMENT INTEREST

The invention described herein may be manufactured, used, sold, imported, and licensed by or for the government of the United States of America without the payment to me of any royalty thereon.

FIELD OF THE INVENTION

The invention relates in general to the field of frequency control, and in particular to an improved method and apparatus for enclosing a crystal oscillator.

BACKGROUND OF THE INVENTION

The main frequency and frequency stability determining element in crystal oscillators is the crystal resonator. The resonance frequencies of crystal resonators change with temperature. Therefore, in the highest stability crystal oscillators, the resonator's temperature is kept constant in an oven. The main drawback of such oven controlled crystal oscillators (OCXO) is the power requirement, that usually prevents the use of OCXOs in battery operated equipment. Designers of OCXOs have strived to minimize the power requirements by using low thermal conductivity materials, such as foam insulators, to isolate the oven from the environment.

The best thermal insulator is a vacuum, together with appropriately finished surfaces in the oven to minimize heat losses by means of radiation. The "tactical miniature crystal oscillator" (TMXO), for example, uses vacuum for thermal insulation, however, using vacuum alone results in some undesirable side effects. The two major side effects are resonances in the mounting structure and manufacturing costs.

Supporting the oscillator in a vacuum insulated enclosure requires some difficult tradeoffs between minimizing heat losses through the supporting structure and providing a sufficiently rigid structure for the vibration resonances to be inconsequential. Wires and thin-walled tubes have been used in the TMXO in attempts to strike a proper balance between the conflicting requirements. The attempts have been only partially successful.

The acceleration sensitivity of crystal oscillators is troublesome in many applications, e.g., in radar systems, especially when the system must operate from a vibrating platform such as an aircraft. Even the lowest acceleration sensitivity oscillators are inadequate in some advanced radar applications, for example. When the oscillator's supporting structure results in resonances at the frequencies that affect the system's performance, the adverse effects of the oscillator's acceleration sensitivity are magnified. In applications where the oscillator's acceleration sensitivity is excessive, vibration isolation is usually employed. The isolation systems present problems of their own, i.e. added size, weight and cost, poor performance against acoustic noise induced vibration, and resonances of the isolation system. Above the isolation system's resonance frequency, the isolation system can be effective, however, at and below that frequency, the isolation system magnifies the problems.

Thus, there exists a need for a low cost, easily manufactured manner in which to isolate an oscillator. The present invention addresses such a need.

SUMMARY OF THE INVENTION

Accordingly, the general object of this invention is to improve the isolation of an oscillator from external mechanical and thermal effects. A more specific object of the invention is to provide an insulation structure for an oscillator that provides both thermal insulation and vibrational isolation above some predetermined low frequency limit which is a function of the mass of the oscillator and the nature of the insulation structure.

It has now been found that the aforementioned objects can be attained and an oscillator supported through the use of aerogels. Aerogels are high strength, highly porous, ultralight materials, that have been referred to as "solid smoke." The density of aerogels can be adjusted over a wide range, from about three times the density of air to about 700 times that of air.

BRIEF DESCRIPTION OF THE DRAWINGS

The features of the invention will be readily understood in light of the following detailed description of the invention and the attached drawings, wherein.

DETAILED DESCRIPTION OF THE INVENTION

Figure 1:
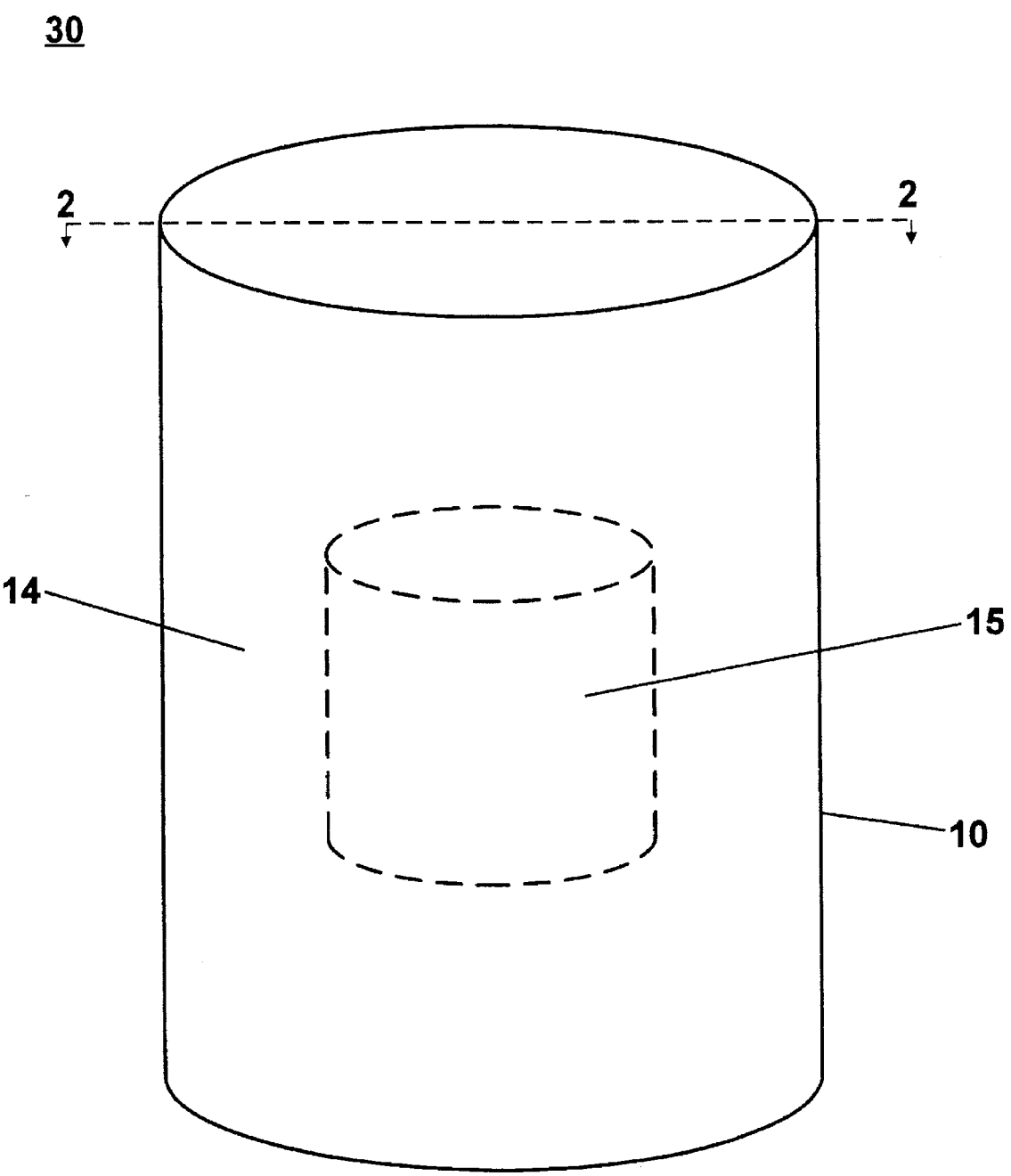
FIG. 1 is a perspective view of the outer enclosure containing the oscillator and aerogel insulation structure.

In its most generic embodiment, the present invention is a crystal oscillator surrounded on all sides with a proper aerogel insulation structure which is used to provide both thermal insulation as well as vibration isolation above some predetermined low frequency limit which is a function of the mass of the oscillator and the nature of the aerogel insulation structure. Because of their remarkably labyrinthine and diaphanous interiors, aerogels exhibit desirable properties for thermal insulation. Aerogels are also very strong, being able to support 1,600 times their weight. This combination of high strength and low thermal conductivity makes aerogels a nearly ideal material for enclosing crystal oscillators, especially when the oscillator is small and lightweight. The aerogels form a resilient cushion that isolates the oscillator from the vibration. When a load is applied, internal friction in the aerogels provides damping of the vibration. Moreover, the aerogel insulation structure will not otherwise adversely affect the functions of the oscillator and associated components (e.g., frequency adjusting means). The aerogels may be in an evacuated enclosure, or in an enclosure that is backfilled with a heavy gas, such as xenon, to minimize the thermal conductivity due to the gas. When the acceleration sensitivity at and below the low frequency limit adversely affects a system's performance, vibration compensation as described in U.S. Pat. No. 4,453,141 to Rosati, for example, can be used to alleviate the problem.

Another embodiment of the invention uses aerogels of multiple stiffnesses in order to achieve nonlinear isolation characteristics. Such characteristics are desirable in situations where the acceleration tends to produce a large deflection, e.g., at low vibration frequencies and at high acceleration levels. In a small OCXO enclosure, especially, low vibration frequencies and high acceleration levels would make the oscillator bump into the sides of the enclosure. Such shocks that are highly undesirable, can be minimized by the use of aerogels, the "spring constants" of which increase with distance between the oscillator and the oscillator enclosure, i.e., the spring constant is maximum at the enclosure wall and minimum at the oscillator.

The oscillator circuitry including the resonator and all other temperature sensitive components is constructed by means of art established methods. The oscillator is designed to be as small and light as possible. The shape of the oscillator approximates the shape of a sphere as much as practicable, so as to minimize the surface area and thereby minimize the power required to maintain the temperature sensitive components of the oscillator at a constant temperature. For example, in one embodiment, the oscillator components are in a 1.5 cm diameter and 1 cm tall cylindrical enclosure, and the outer enclosure is a 3.5 cm diameter and a 3 cm tall cylinder. The 1 cm gap between the inner oscillator enclosure and the outer enclosure is filled with aerogel.

One way to assemble the aerogel insulated oscillator is to make the outer enclosure of two half-cylinders, suspend in each half-cylinder an inner cylinder which is the same size as the oscillator cylinder, fill the spaces between the half-cylinders and the inner cylinders with aerogel, remove the inner cylinders, place the oscillator cylinder into one of the half-cylinders, and join the second half-cylinder to the first so as to form a hermetically sealed enclosure in which the oscillator is surrounded by the aerogel.

Figure 2:
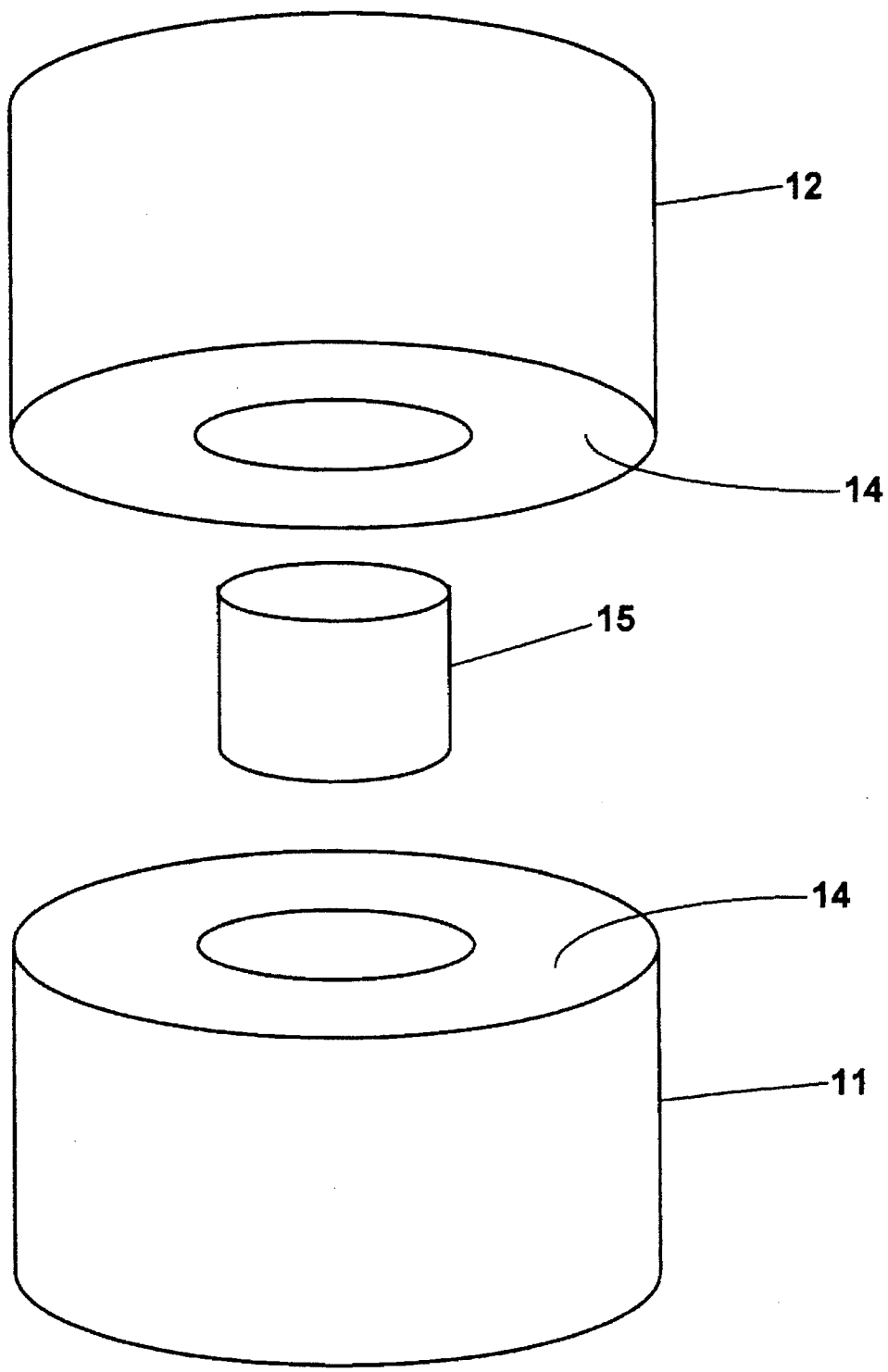
FIG. 2 is a perspective view of the half-cylinder components of the outer enclosure.
Figure 3:
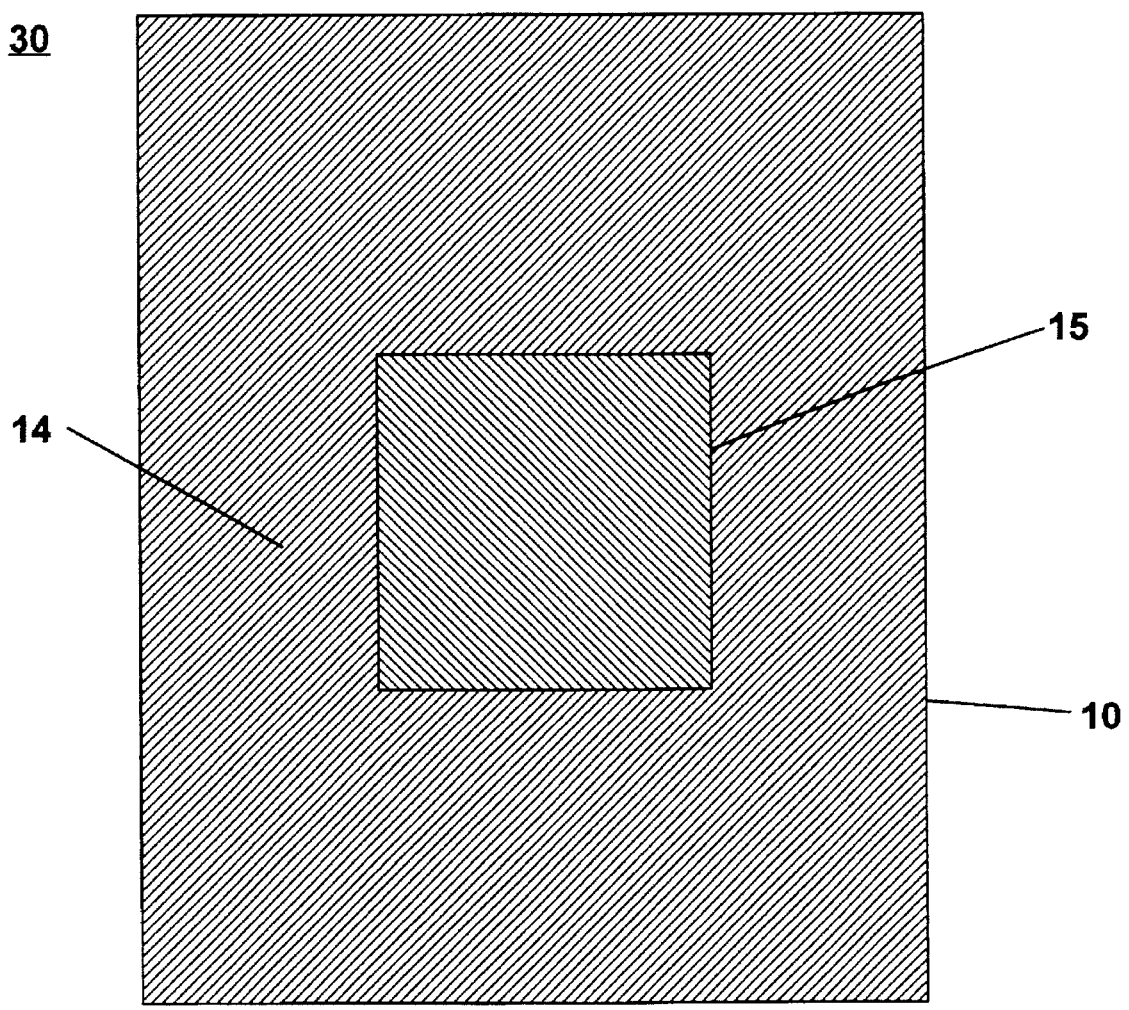
FIG. 3 is a side elevation in cross-section taken along line 2—2 of FIG. 1.
Figure 4:
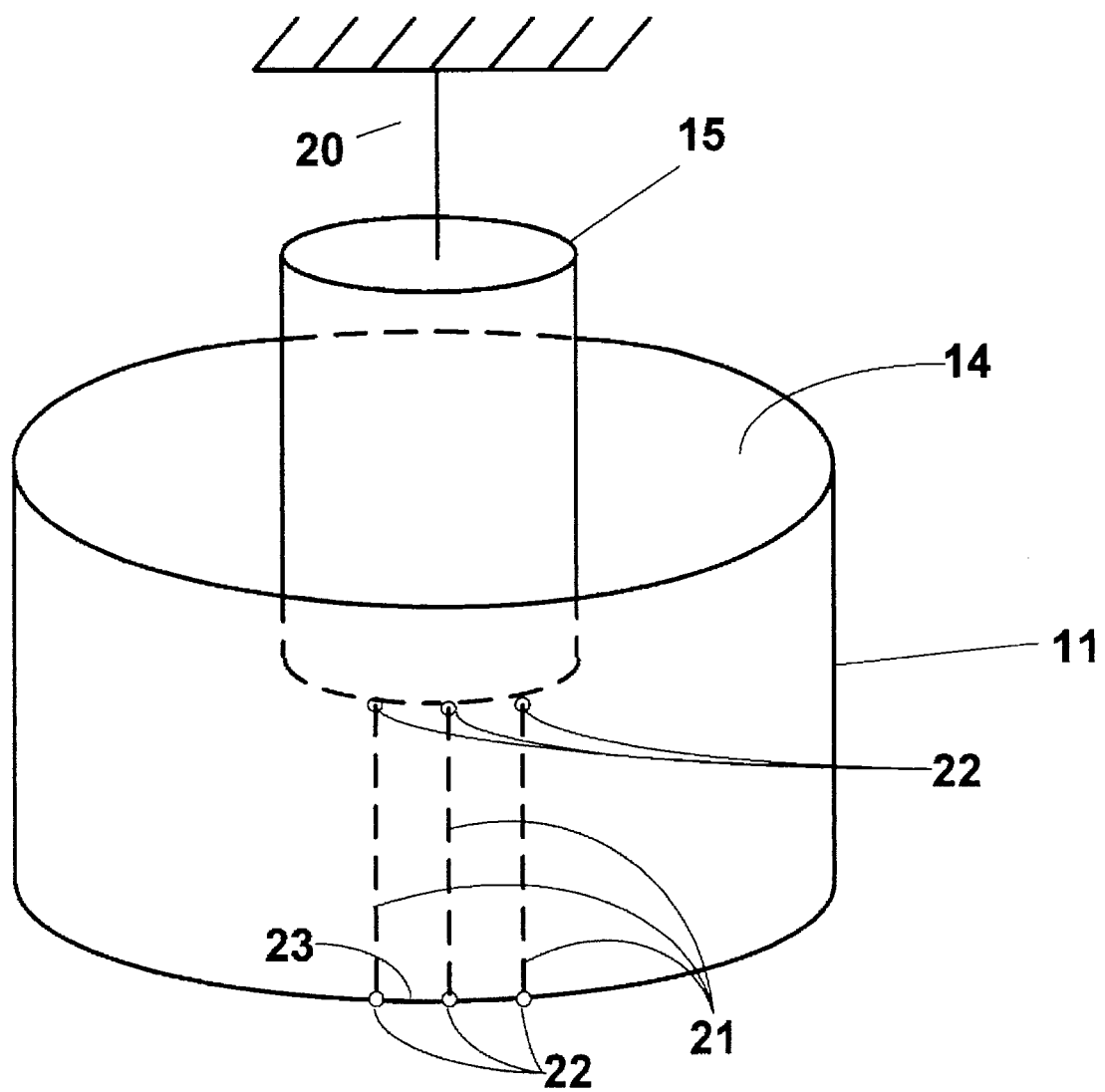
FIGS. 4 and 5 are perspective views of the half-cylinder components of the outer enclosure which are shown in combination with the inner cylindrical enclosures, helpful to understanding a method of forming the aerogel insulation structure therebetween.

For a more detailed understanding of the method summarized above for assembling the aerogel insulated oscillator, attention is invited to FIGS. 1 through 6. FIG. 1 shows an aerogel insulated oscillator 30 comprising outer enclosure 10, an inner oscillator enclosure 15, and an aerogel 14 formed therebetween. FIG. 2 shows the two half-cylinders 11 and 12 which are joined together to form the outer enclosure 10. FIG. 3 further illustrates a cross-sectional view of the completed assembly. Referring to FIG. 4, inner oscillator enclosure 15 contains the oscillator circuitry, including the resonator. The oscillator enclosure 15 is temporarily suspended in half-cylinder 11 by clamping oscillator enclosure 15 to a temporary suspension means 20 (e.g., rigid rod and support assembly or other suitable means). Electrical leads 21 are bonded to electrical feedthroughs 22 in both header 23 and oscillator enclosure 15. The header 23 is bonded to half-cylinder 11. The space between half-cylinder 11 and the oscillator enclosure 15 is filled with the aerogel 14. For example, as is well known in the art, the aerogels can be made by first preparing a gel, such as by using a sol-gel process. The gel is poured or injected into a mold, such as the one formed by suspending oscillator enclosure 15 within half-cylinder 11. The mold containing the gel is placed into an autoclave and the gel, which includes a solvent, is heated under pressure so as to evacuate the solvent under hypercritical conditions. After this drying, what remains is the aerogel 14 in the molded shape for the desired application.

Figure 5:
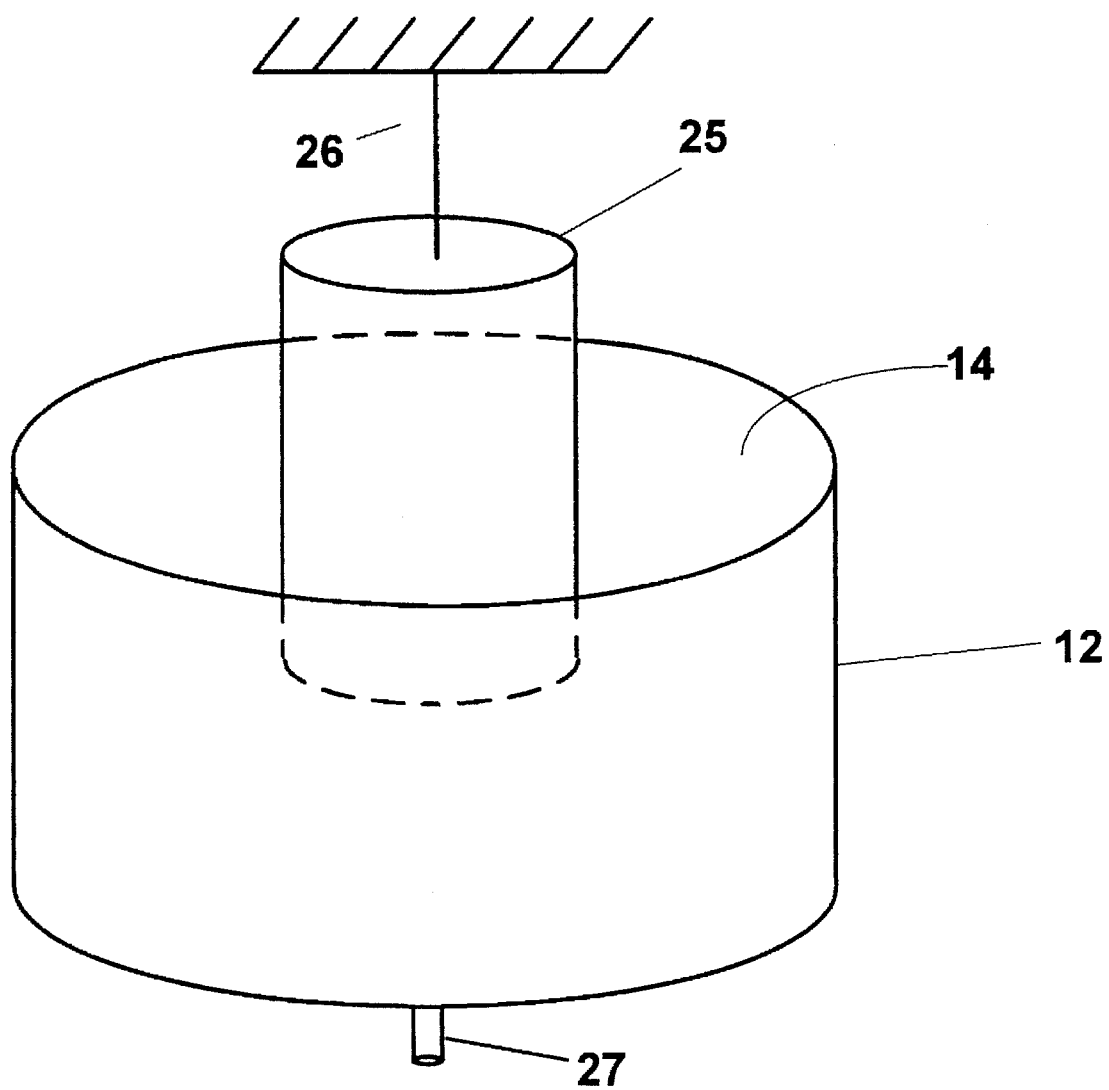

Similarly, in FIG. 5, a dummy enclosure 25, which has a size and shape that is identical to that of oscillator enclosure 15, is suspended temporarily within half-cylinder 12 using a temporary suspension means 26. The space between dummy enclosure 25 and half-cylinder 12 is filled with the aerogel 14 in the same manner as previously described.

To complete the assembly, temporary suspension means 20 and 26 are removed, along with dummy enclosure 25 which is removed from half-cylinder 12. The half-cylinder 12 containing the molded aerogel 14 is inverted and placed upon the half-cylinder 11 containing the molded aerogel 14 and oscillator enclosure 15, and the two half-cylinders 11 and 12 are bonded together. As a result, the oscillator enclosure 15 is completely surrounded by aerogel 14 so that there is no space therebetween. In addition, the wiring connections (e.g., electrical leads 21, feedthroughs 22, and header 23) are also covered with aerogel 14.

As depicted in FIG. 5, half-cylinder 12 may contain an orifice or tubulation means 27, through which the space containing the aerogel 14, located between the oscillator enclosure 15 and outer enclosure 10, can be evacuated or back-filled so as to minimize the heat losses through the aerogels. For example, although aerogel 14 completely surrounds oscillator enclosure 15, aerogels are extremely porous materials comprised of a plurality of microcaverns. Therefore, in one embodiment, the space would be evacuated and the tubulation means 27 would be pinched off or otherwise sealed so as to hermetically seal the completed assembly and leave the aerogel 14 in a vacuum. In another embodiment, the space would be evacuated and back-filled with a heavy gas such as xenon. Although heat losses through xenon are higher than the losses through a vacuum, xenon back-filling results in a less stringent requirement on hermeticity and outgassing than with the vacuum embodiment.

Figure 6:
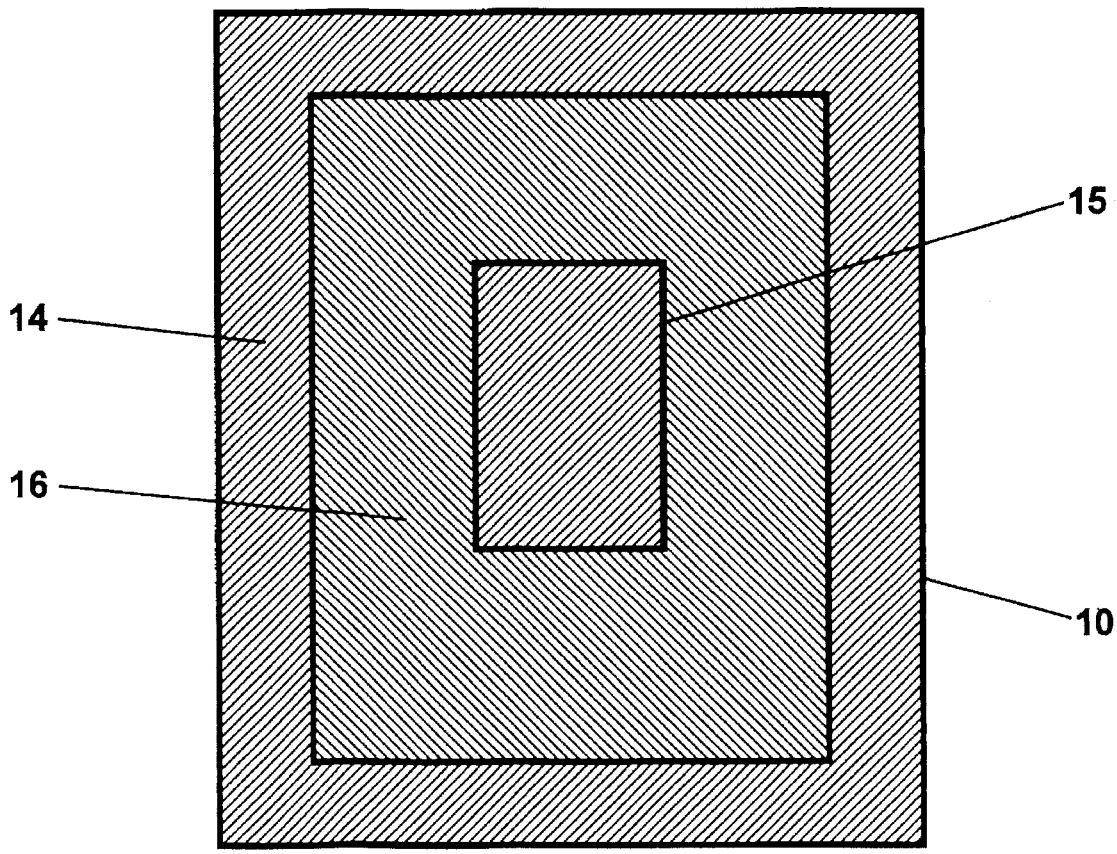
FIG. 6 is a side elevation in cross-section taken along line 2—2 of FIG. 1 helpful in understanding the alternative embodiment if multiple layers of aerogel are used to surround the oscillator.

For an alternative embodiment that employs two aerogels 14 and 16, the aerogel insulated oscillator 30 can be assembled in a similar manner as described above by using iterative steps. For example, an additional set of dummy enclosures (not shown in the accompanying figures), which are intermediate in size between the oscillator enclosure 15 and the half-cylinders 11 and 12, are suspended in half-cylinders 11 and 12. The first aerogel 14 is formed in the space that exists between the intermediate sized dummy enclosures (not shown) and the half-cylinders 11 and 12 by the method previously described. The intermediate sized dummy enclosures are then removed and oscillator enclosure 15 and dummy enclosure 25 are then suspended in the cavities formed by the first aerogel 14 in half-cylinders 11 and 12 respectively. The second aerogel 16 is formed so as to fill the space between the first aerogel 14 and oscillator enclosure 15 and dummy enclosure 25. The remaining steps of the process previously described are then performed to complete the assembly. FIG. 6 shows the completed assembly that comprises two aerogels 14 and 16 (e.g., of different stiffnesses) surrounding oscillator enclosure 15. By using a multiplicity of dummy enclosure sizes, one may similarly form multiple aerogel layers as the insulating material.

Although the present invention has been described in relation to several different embodiments, I wish it to be understood that I do not desire to be limited to the exact details of construction shown and described, since obvious modifications will become apparent to a person skilled in the art. Therefore, the present invention should not be construed to be limited by the specific disclosure, but only by the appended claims.

What is claimed is:

1. An improved method of isolating an oscillator from external mechanical and thermal effects, of the type wherein the oscillator is surrounded by a support structure, the improvement comprising the step of surrounding the oscillator on all sides with an aerogel insulation structure sufficient to provide both thermal insulation and vibrational isolation of the oscillator.

2. An improved method according to claim 1, further comprising the step of evacuating an enclosure containing the aerogel insulation structure.

3. An improved method according to claim 1, further comprising the step of backfilling an enclosure containing the aerogel insulation structure with a heavy gas.

4. An improved method according to claim 1, further comprising the step of backfilling an enclosure containing the aerogel insulation structure with xenon.

5. An improved oscillator of the type having a support structure for isolating the oscillator from external mechanical and thermal effects, wherein the improvement comprises an aerogel insulation structure surrounding the oscillator on all sides, wherein the aerogel insulation structure is sufficient to provide both thermal insulation and vibrational isolation.

6. An improved oscillator according to claim 5, wherein the aerogel surrounding the oscillator is in an evacuated enclosure.

7. An improved oscillator according to claim 5, wherein the aerogel surrounding the oscillator is in an enclosure that is backfilled with a heavy gas.

8. An improved oscillator according to claim 7, wherein the heavy gas is xenon.

9. An improved oscillator of the type having a support structure for isolating the oscillator from external mechanical and thermal effects, wherein the improvement comprises an insulation structure surrounding the oscillator on all sides, said insulation structure comprising a plurality of aerogel layers of multiple stiffnesses, wherein said insulation structure is sufficient to provide both thermal insulation and vibrational isolation of the oscillator.

10. An improved oscillator according to claim 9, wherein the plurality of aerogel layers surrounding the oscillator are in an evacuated enclosure.

11. An improved oscillator according to claim 9, wherein the plurality of aerogel layers surrounding the oscillator are in an enclosure that is backfilled with a heavy gas.

12. An improved oscillator according to claim 11, wherein the heavy gas is xenon.

* * * * *